United States Patent
Uchiyama et al.

(10) Patent No.: US 6,746,938 B2
(45) Date of Patent: Jun. 8, 2004

(54) MANUFACTURING METHOD FOR SEMICONDUCTOR DEVICE USING PHOTO SENSITIVE POLYIMIDE ETCHING MASK TO FORM VIAHOLES

(75) Inventors: Hiroyuki Uchiyama, Musashimurayama (JP); Takashi Shiota, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/163,311

(22) Filed: Jun. 7, 2002

(65) Prior Publication Data

US 2003/0003724 A1 Jan. 2, 2003

(30) Foreign Application Priority Data

Jun. 27, 2001 (JP) .......................... 2001-194078

(51) Int. Cl.[7] .......................... H01L 21/30; H01L 21/46
(52) U.S. Cl. ......................... 438/459; 438/455
(58) Field of Search .................. 438/459, 667, 438/928, 977

(56) References Cited

U.S. PATENT DOCUMENTS

| | | | | |
|---|---|---|---|---|
| 4,537,654 A | * | 8/1985 | Berenz et al. ............... | 438/176 |
| 4,859,629 A | * | 8/1989 | Reardon et al. ............ | 438/492 |
| 4,898,804 A | * | 2/1990 | Rauschenbach et al. ..... | 430/311 |
| 5,420,067 A | * | 5/1995 | Hsu ............................. | 438/700 |
| 5,434,094 A | * | 7/1995 | Kobiki et al. ................ | 438/167 |
| 5,488,253 A | * | 1/1996 | Matsuoka .................... | 257/622 |
| 5,556,812 A | * | 9/1996 | Leuschner et al. ........... | 438/623 |
| 5,728,628 A | * | 3/1998 | Havemann ................... | 438/668 |
| 5,807,783 A | * | 9/1998 | Gaul et al. ................... | 438/406 |
| 5,827,780 A | * | 10/1998 | Hsia et al. ................... | 438/692 |
| 6,365,513 B1 | * | 4/2002 | Furukawa et al. ........... | 438/667 |
| 6,444,138 B1 | * | 9/2002 | Moon et al. ................. | 216/79 |
| 2001/0006233 A1 | * | 7/2001 | Vallett ......................... | 257/48 |

OTHER PUBLICATIONS

Kofol, J. et al., "A Backside Via Process For Thermal Resistance Improvement Demonstrated Using GaAs HBTs", Proc. IEEE GaAs IC Symposium, 1992, pp. 267–270.

* cited by examiner

Primary Examiner—John F. Niebling
Assistant Examiner—Angel Roman
(74) Attorney, Agent, or Firm—Miles & Stockbridge P.C.

(57) ABSTRACT

A method manufactures a semiconductor device by forming at least an active device on a principal surface of a semiconductor substrate; etching the semiconductor substrate to thereby form a viahole adjacent to an active region where the active device is formed; and forming a plated wiring including the inner wall of the viahole and extending to an electrode of the active device on the surface of the substrate. This method uses a photo sensitive polyimide material as an etching mask in the step of forming a viahole and can thereby form a fine viahole in a high yield.

12 Claims, 8 Drawing Sheets

MANUFACTURING METHOD FOR SEMICONDUCTOR DEVICE USING PHOTO SENSITIVE POLYIMIDE ETCHING MASK TO FORM VIAHOLES

BACKGROUND OF THE INVENTION

1. Field of the Invention

The present invention relates to a method of manufacturing a semiconductor device. More specifically, it relates to a method of manufacturing a compound semiconductor device using viaholes (through-chip holes) in order to improve the high frequency properties of the semiconductor device or to prevent temperature rise.

2. Description of the Related Art

A technique for the formation of "viaholes" has become important in monolithic microwave integrated circuits (hereinafter abbreviated as MMICs) and other superhigh frequency semiconductor devices. In this technique, a substrate is grounded from its back side via through-chip holes in order to improve the high frequency properties or to dissipate heat generated during operation.

Such viaholes are generally formed according to the following process as described in, for example, Proc. IEEE GaAs IC Symposium, pp. 267–270 (1992). Specifically, a semiconductor substrate carrying a semiconductor device formed on its principal surface is thinned by backside grinding, backside lapping or polishing, the thinned semiconductor substrate is reversed and is affixed to a base wafer such as a glass substrate with the use of, for example, heat-resistant waxes, and the substrate is subjected to dry etching or wet etching from the back side of the substrate on which no semiconductor device is formed to thereby form viaholes.

However, the aforementioned process cannot significantly use highly selective dry etching masks such as $SiO_2$ films or metal masks that are allowed to adhere to the substrate by treatment at elevated temperatures, since waxes used to affix the thinned substrate in this process are softened during processing of the viaholes at such elevated temperatures.

Accordingly, the process can only use mask materials such as negative type thick layer photoresists. However, with reference to FIG. 1A schematically illustrating a cross section of a formed viahole, these mask materials exhibit low selectivity with respect to a semiconductor material 1 and cannot significantly be controlled in viahole dimension due to regression 3 of a mask 2 to thereby fail to form a fine viahole 13.

In addition, the resist mask 2 is regressed during the dry etching process, and the regression 3 of the resist mask 2 affects a side wall to be processed to thereby invite a rough surface 4 of the side wall. Such a rough side wall may decrease the coverage of a metal during the subsequent metal plating process. A demand has therefore been made on a highly selective mask material that can form a mask at low temperatures and can yield, by etching, a viahole-region having a smooth side wall as shown in FIG. 1B, exhibiting high anisotropy and having a good sectional shape.

SUMMARY OF THE INVENTION

Accordingly, an object of the present invention is to solve the problems of the conventional technologies and to provide a method of manufacturing a semiconductor device, which method can form fine viaholes in high yields and can thereby produce a high-performance superhigh-frequency semiconductor device by the use of a mask material that has high dry etching resistance and can form a mask at low temperatures in a process for forming viaholes of a semiconductor.

Specifically, the present invention provides, in a first aspect, a method of manufacturing a semiconductor device. The method includes the steps of forming at least an active device on a principal surface of a semiconductor substrate; etching the semiconductor substrate to thereby form a viahole adjacent to an active region where the active device is formed; and forming a plated wiring, which plated wiring includes the inner wall of the viahole and extends to an electrode of the active device on the surface of the substrate. In this method, a photo sensitive polyimide material is used as an etching mask in the step of forming a viahole.

In the above method, the step of forming a viahole may include the step of etching the semiconductor substrate from the surface of the substrate on which the active device is formed.

Alternatively, the step of forming a viahole may include the step of etching the semiconductor substrate from the back side of the substrate opposite to the surface on which the active device is formed.

In a second aspect, the present invention provides another method of manufacturing a semiconductor device. The method includes the steps of forming at least an active device on a principal surface of a semiconductor substrate; etching the semiconductor substrate with the use of a photo sensitive polyimide material as an etching mask from the surface of the substrate on which the active device is formed to thereby form a viahole adjacent to an active region where the active device is formed; forming a plated wiring, which plated wiring includes the inner wall of the viahole and extends to an electrode of the active device on the surface of the substrate; reversing the substrate and temporarily fixing the reversed substrate on a base wafer with an adhesive; grinding or polishing the back side of the semiconductor substrate temporarily fixed on the base wafer to thereby thin the substrate; subjecting the thinned substrate to wet etching to thereby make the plated wiring at the inside bottom of the viahole open; and separating the semiconductor substrate carrying the viahole from the base wafer.

In the above methods according to the first and second aspects, the semiconductor substrate may be a substrate including a multi-layer epitaxial film of III–V compound semiconductor.

In a third aspect, the present invention provides another method of manufacturing a semiconductor device. This method includes the steps of forming at least an active device on a principal surface of a semiconductor substrate; etching the semiconductor substrate with the use of a photo sensitive polyimide material as an etching mask from the surface of the substrate on which the active device is formed to thereby form a viahole adjacent to an active region where the active device is formed; forming a plated wiring, which plated wiring includes the inner wall of the viahole and extends to an electrode of the active device on the surface of the substrate; reversing the substrate and temporarily fixing the reversed substrate on a base wafer with an adhesive; grinding or polishing the back side of the semiconductor substrate temporarily fixed on the base wafer to thereby thin the substrate; etching the thinned substrate with the use of a photo sensitive polyimide material as an etching mask in a region to be a viahole and a region directly underneath the active device on the surface of the substrate from the back side of the substrate to make the plated wiring at the inside bottom of the viahole open to thereby form a viahole structure and a heat-sink structure in one process step; plating a metal on overall of the back side of the substrate to thereby form a plated metal layer; and separating the semiconductor substrate carrying the viahole from the base wafer.

The present invention also relates to a method of forming a viahole. The method includes the steps of forming a pilot hole having a depth of about several micrometers to ten micrometers with an accuracy of from 0.01 micrometer to several micrometers in a region to be a viahole from its surface using a very highly selective silicon oxide film or metal mask; reversing the substrate and thinning the reversed substrate from its back side to a finishing thickness of the substrate; etching the thinned substrate from the back side thereof according to the method of the first aspect of the present invention to thereby form a deep hole having a diameter of opening space larger than that of the pilot hole; and thus connecting the deep hole and the pilot hole with each other to thereby form a viahole.

The present invention also relates to a technique in which viaholes are formed according to the method of the first or second aspect of the invention, the formed viaholes are covered with or filled with a metal by vapor deposition, metal plating or another technique and are then molded or sealed with the photo sensitive polyimide material in all or necessary portions thereof.

The present invention also relates to a field effect transistor manufactured by the method of manufacturing a semiconductor device of the present invention and to a semiconductor high-frequency circuit using the field effect transistor. In these devices, source electrodes are formed in a position adjacent to a multi-fingered electrode, and viaholes 1 to 20 $\mu$m wide are formed directly underneath and adjacent to the source electrodes in order to ground from the back side of a semiconductor substrate. In this configuration, each of the viaholes corresponds to each finger of the multi-fingered electrode.

In addition and advantageously, the present invention relates to a bipolar transistor, a hetero-junction bipolar transistor and semiconductor high-frequency circuits using these transistors. In these devices, viaholes 1 to 20 $\mu$m wide are formed outside the isolation boundary of the transistor. Each of the viaholes corresponds to each of emitter electrodes.

A feature of the present invention to achieve the above objects is the use of a photo sensitive polyimide material as an etching mask in the formation of viaholes by dry etching. When the photo sensitive polyimide material is cured, it exhibits stable properties near to those of glass, has satisfactory resistance to dry etching and can yield a film having a controlled and uniform thickness by spin coating as in conventional photoresists.

It is also advantageous that the photo sensitive polyimide material can form a thick layer about 10 to 40 $\mu$m thick in one process step in contrast to $SiO_2$, while the resulting thickness depends on the viscosity of the photo sensitive polyimide material. In addition, the etching mask using the material can form patterns using an exposure system as in the conventional photoresists and can thereby simplify the process.

For example, when viaholes are formed on a GaAs substrate from the surface thereof, a possible candidate as a mask is, for example, a $SiO_2$ mask that is formed by conventional atmospheric pressure chemical vapor deposition (CVD) or plasma CVD and has satisfactory etching resistance. However, while depending on its selectivity, such a mask for use herein must have a thickness of at least 5 $\mu$m in order to form a hole about 80 $\mu$m deep, and such a thick mask cannot commercially be manufactured in volume by conventional CVD processes.

When viaholes are formed after the formation of high electron mobility transistors (HEMTs), hetero-junction bipolar transistors (HBTs), metal semiconductor field emission transistors (MESFETs) and other devices and circuits thereof on a principal surface of a compound semiconductor substrate, these devices and circuits undergo high temperatures of equal to or more than 300° C. or plasma induced damage during the formation of the viaholes. This technique therefore lacks practicability.

According to the conventional CVD processes, an etching mask is obtained after the formation of a resist mask and subsequent dry etching. In contrast, the use of the photo sensitive polyimide material according to the present invention as an etching mask can yield an etching mask by a single photo-etching process, and the resulting etching mask obtained in one process step can have a film thickness of about 10 to 40 $\mu$m and exhibits a significantly high throughput.

The resulting photo sensitive polyimide mask can be cured at relatively low temperatures of from about 200° C. to about 250° C. after exposure and development. The cured polyimide material exhibits a high selectivity of equal to or more than 20 to dry etching and can thereby yield viaholes with significantly good shapes as compared with the use of conventional thick layer photoresists each having a selectivity of from about 3 to about 5.

In the method of forming a viahole using a conventional resist mask, the target viahole has a design diameter of opening space of 40 $\mu$m$\phi$ but exhibits an enlarged finish diameter of opening space of about 80 $\mu$m$\phi$ due to the regression of the mask during the formation of the viahole 80 $\mu$m deep. However, by using the highly selective polyimide mask according to the present invention, a viahole having a diameter of opening space close to the design diameter thereof can be obtained without significant enlargement of the diameter of opening space.

This means that the combination of the technique according to the present invention with the technique for the formation of a viahole from the surface of the semiconductor substrate can yield a fine viahole having a diameter of about 0.5 to 1.0 $\mu$m$\phi$ which cannot be formed by the conventional methods.

After the formation of a viahole according to the above method, at least the inner wall of the formed viahole is covered with a metal by, for example, plating. The side wall in the formed viahole is very smooth to thereby ensure easy coverage and a sufficient thickness of the metal in the subsequent metal plating process and to improve reliability of the resulting viahole. This is because the photo sensitive polyimide material according to the present invention can yield a viahole exhibiting a high selectivity with minimized roughness of the side wall, which roughness occurs when the conventional mask materials having a low selectivity are used.

The viahole is then subjected to the metal plating process and a subsequent patterning process by etching for the formation of wiring. The reliability of the resulting viahole can further be improved by filling and molding (sealing) necessary portions of the patterned viahole with the photo sensitive polyimide material according to the present invention. In this procedure, the photo sensitive polyimide material does not significantly affect the high frequency properties of the product device, since it has a sufficiently low dielectric constant of about 2 to 3 at a frequency of 1 kHz.

Next, the GaAs substrate carrying the semiconductor devices on its principal surface is reversed and is then affixed to a base wafer such as glass wafer with the use of a wax, the back side of the substrate on which no semiconductor device is formed is thinned by etching or grinding to thereby make the bottom surface of the viahole open, which viahole carries the metal layer and is formed in the substrate. This procedure cannot use the masks that are formed by treatment at high temperatures, such as a $SiO_2$ mask, but can only use thick layer photoresists having a low selectivity, since the wax used is softened at such high temperature treatment. However, by using the photo sensitive polyimide material through post-exposure baking at 110° C. for several minutes without curing, the viahole can highly selectively be processed as compared with the use of the conventional thick layer photoresists.

While the cured photo sensitive polyimide material exhibits a selectivity of about 20, the photo sensitive polyimide material which has been post-exposure baked without curing exhibits a somewhat low selectivity of about 10 but can yield a viahole having a good shape as compared with the use of the conventional photoresists each having a selectivity of from 3 to 5.

In addition, the viahole formed by the use of the photoresists has a thick polymer layer on its side wall and invites some troubles. However, the use of the photo sensitive polyimide material does not invite such troubles and can form a viahole having a smooth surface with a profile having a high aspect ratio.

BRIEF DESCRIPTION OF THE DRAWINGS

FIGS. 1, 1A and 1B are sectional views illustrating the relationship between the selectivity of a mask and the sectional shape (profile) of a viahole;

DESCRIPTION OF THE PREFERRED EMBODIMENTS

The present invention will be illustrated in further detail with reference to several embodiments and attached drawings.

First Embodiment

FIGS. 2A to 2G are sectional views illustrating a manufacturing process of an MMIC as an embodiment of the present invention. In this process, viaholes 13 are formed from the surface of a semi-insulating GaAs substrate carrying semiconductor devices previously formed thereon. In this process, the present invention is applied to manufacture of the MMIC mainly comprising a metamorphic HEMT device.

Figure 1:
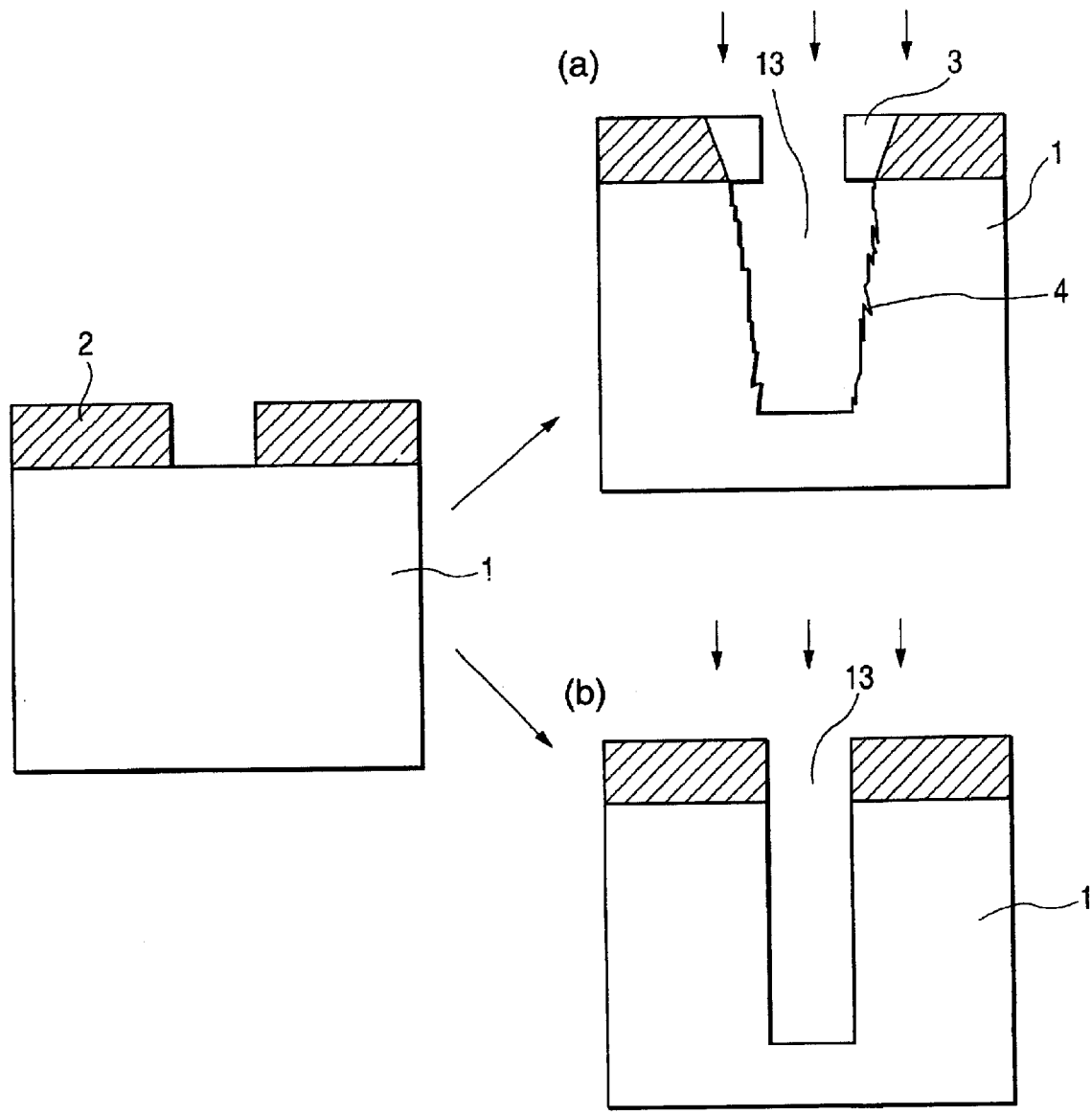
Figure 2A:
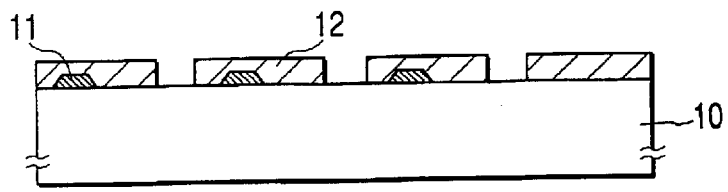
FIGS. 2A to 2G are sectional views illustrating a process of forming surface viaholes of an MMIC mainly comprising a metamorphic HEMT device as an embodiment of the present invention.

Initially, with reference to FIG. 2A, plural main device units 11 of MMIC are formed on a GaAs substrate 10 and are then covered with a passivation film or a polyimide resin, followed by formation of a mask pattern having openings only in regions on which viaholes 13 will be formed according to a conventional patterning process. The method of present invention uses a photo sensitive polyimide material 12 in the formation process of the mask pattern and can concurrently yield an etching mask for the formation of the viaholes 13 and the passivation film for the MMIC circuit in one process step. It can thereby significantly reduce the number of process steps. The photo sensitive polyimide material 12 used herein is a negative type photo sensitive polyimide material having a viscosity of 8±0.5 Pa·s (25° C.).

In this embodiment, the main device units 11 have been formed in advance, but the viaholes 13 can be formed in advance of the main device units 11 without problems. The time of the formation of the devices is not specifically limited.

The photo sensitive polyimide mask 12 can yield a thick film about 10 to about 20 $\mu$m thick in one process step. After curing at 200° C. to 250° C., the resulting photo sensitive polyimide mask 12 has a thickness of about 6 to about 12 $\mu$m, i.e. about half the initial thickness. However, the mask can sufficiently be resistant to dry etching process for the formation of viaholes 80 $\mu$m or more deep on the GaAs substrate.

Figure 2B:
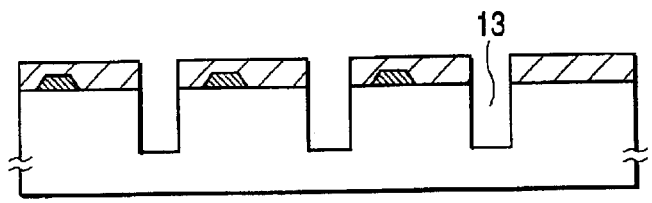

Next, with reference to FIG. 2B, the viaholes 13 are formed by dry etching using the photo sensitive polyimide mask 12. The dry etching process can be performed, for example, by electron cyclotron resonance (ECR) etching under the following conditions: Microwave power: 400 W, power density of RF bias of 13.56 MHz: 0.3 kW/m$^2$, etchant: $SiCl_4$, and etching pressure: 2.0 mTorr. In this procedure, the photo sensitive polyimide mask used herein shows a high selectivity to GaAs of 20.

Specifically, the photo sensitive polyimide mask for use in the present invention has a selectivity 4 to 7 times higher than the selectivity of conventional acrylic acid resin negative type thick layer resists, from 3 to 5. As described above, the methods of forming viaholes using conventional negative type resists as masks cannot avoid rough side walls of the resulting viaholes due to the regression of the resists during dry etching. However, the method of the present invention using the photo sensitive polyimide material as a mask can prevent rough side walls of the viaholes, and the resulting viaholes have smooth side walls and exhibit anisotropy in their shapes. Thus, the viaholes 13 having a diameter of opening space of 5 $\mu$m×50 $\mu$m and a depth of 80 $\mu$m can be formed.

Figure 2C:
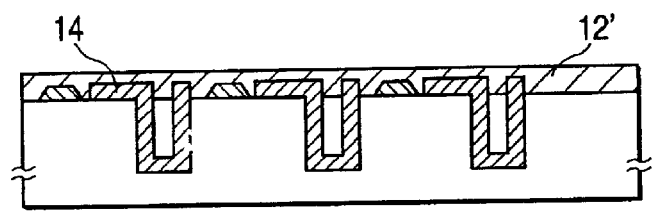

According to the conventional methods, the rough side walls of the viaholes invite a decreased thickness of a gold coating 14 formed in a subsequent gold plating process shown in FIG. 2C. To avoid this problem, the methods require a smoothing treatment by wet etching. However, the method of the present invention does not require the smoothing treatment and can significantly shorten the process steps.

With reference to FIG. 2B, after the formation of the viaholes 13 by dry etching, the photo sensitive polyimide mask 12 is removed by treatment with an aqueous ammonia in a concentration of about 1% by weight for about 3 minutes. The viaholes 13 are then subjected to washing and then to base metal coating by vapor deposition. In this embodiment, a Mo/Au thin deposited film with a thickness of 20 nm/800 nm is formed. The viaholes 13 are then subjected to a gold plating process to thereby form a gold wiring 14 extending from inside the viaholes 13 to the vicinity of the MMIC devices on the surface of the substrate.

The method of the present invention can yield the gold plated viaholes 14 each having a side wall with a smoothly formed surface. The gold plating formed herein has a thickness of at least 5 $\mu$m even in the thin-most side wall in the vicinity of the bottom of the viahole. The method can thereby exhibit a yield 50% or more higher than that of methods using the conventional resists.

With reference to FIG. 2C, after the gold plating process, the viaholes are filled with and the surface of the substrate is covered with the photo sensitive polyimide material 12' to thereby protect the inside of the viaholes and the wiring by the photo sensitive polyimide material 12'.

Figure 2D:
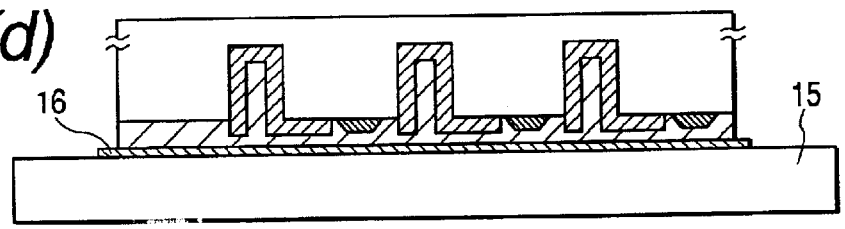

Next, with reference to FIG. 2D, the substrate 10 (wafer) is reversed and is placed on a base wafer 15 made of, for example, glass or sapphire. The surface of the substrate 10 on which the devices 11 are formed is affixed to the base wafer 15 using a heat-resistant wax 16 (a proof wax with a softening point of 150° C.).

Figure 2E:
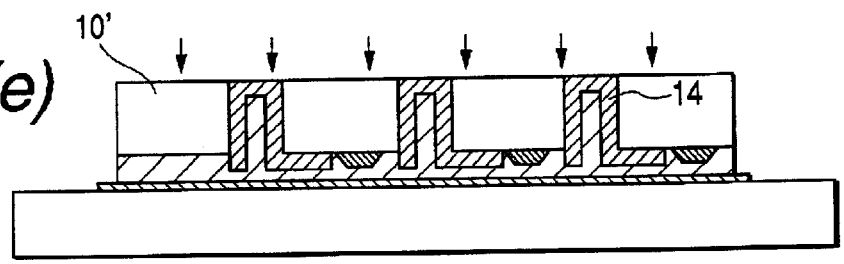

With reference to FIG. 2E, the substrate 10 is thinned 50 to 100 $\mu$m from its back side in the following manner. Specifically, the substrate 10 is sequentially subjected to mechanical grinding with diamond particles, polishing and wet etching about 10 $\mu$m deep with a sulfuric acid etchant ($H_2SO_4:H_2O_2:H_2O=1:8:8$) to remove warpage. In this procedure, the substrate 10 may be thinned from its back side to such a thickness (depth) that the viaholes are completely open (completely through-out). Alternatively, the thinning operation is stopped immediately before the viaholes are completely open, the mask is then formed, and the substrate is etched to thereby allow the viaholes to penetrate the substrate. In any cases, by filling the viaholes 13 with the photo sensitive polyimide material 12' immediately before thinning of the substrate, irregular or abnormal etching and thinning can be prevented to thereby improve reliability of the resulting device.

Figure 2F:
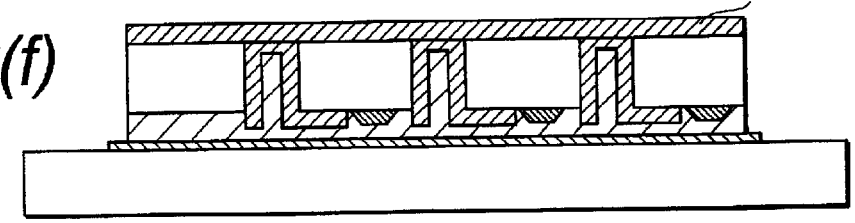
Figure 2G:
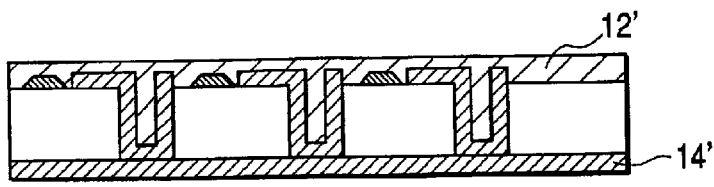
Figure 3A:
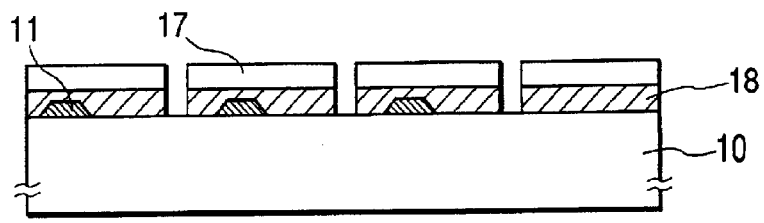
FIGS. 3A to 3G are sectional views illustrating an another process of forming surface viaholes of an MMIC mainly comprising a metamorphic HEMT device as another embodiment of the present invention.
Figure 3B:
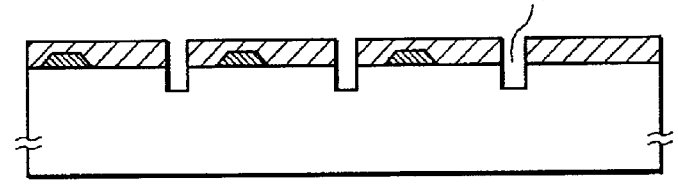
Figure 3C:
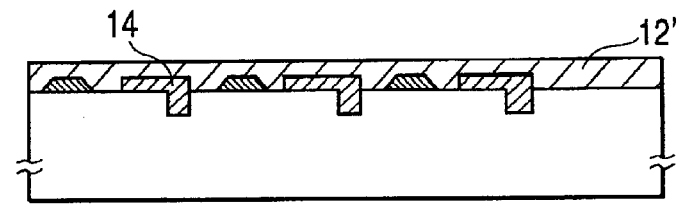
Figure 3D:
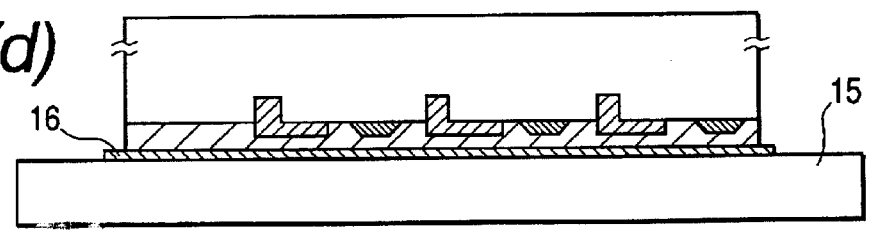
Figure 3E:
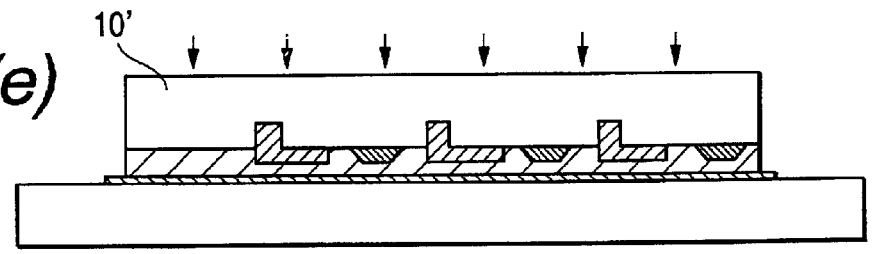
Figure 3F:
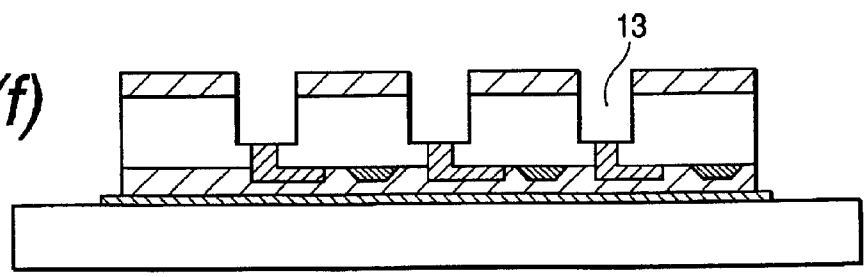
Figure 3G:
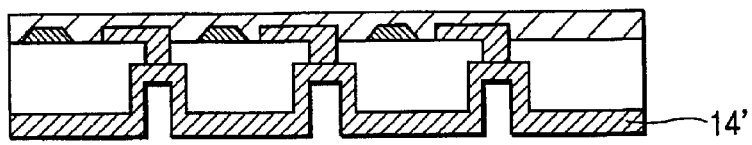

With reference to FIG. 2F, the overall back side of the substrate is covered with a base metal coating (Ho/Au thin deposited film) and is then plated with gold 14' to connect with the viaholes to thereby yield an MMIC. Ultimately, the substrate 10' carrying the MMIC is separated from the base wafer 15 and thereby yields the target MMIC mainly comprising the metamorphic HEMT device as shown in FIG. 2G.

The method of the present invention can form viaholes in a yield 50% or more higher, a layout tolerance significantly higher and a reduced area of the resulting chip 50% or more smaller than the methods using the conventional negative type thick layer resists.

According to the method of the present invention, the diameters of the viaholes 13 can be reduced from 40 to 60 $\mu$m$\phi$ in conventional equivalents to 5 $\mu$m×50 $\mu$m or less. By effectively arranging these fine viaholes, the high frequency properties of the resulting device can be improved.

When a module including a viahole having a design dimension of 5 $\mu$m×50 $\mu$m per four to eight devices is actually prepared, the resulting module exhibits a high frequency gain 3 dBm or more higher than those of conventional equivalents at 77 GHz. These advantages can also be obtained on MMICs mainly comprising GaAs HEMTs and MESFETs using semi-insulating GaAs substrates as in this embodiment.

Second Embodiment

With reference to a process shown in FIGS. 3A to 3G, surface viaholes of an MMIC mainly comprising a metamorphic HEMT device are formed. Initially, devices 11 are formed on a substrate 10, and a $SiO_2$ mask 18 about 1 $\mu$m thick is then formed according to a conventional procedure such as photolithography in combination with dry etching using a resist mask 17. Subsequently, pilot holes having a depth of about several micrometers to twenty micrometers and a width of from about 0.1 to about 20 $\mu$m are formed according to the dry etching process as in First Embodiment with high precision of an alignment accuracy of ±0.01 $\mu$m or less.

Next, wiring is formed by application of base metals and plating, the resulting substrate is reversed and is affixed to a base wafer such as a sapphire or glass wafer using a heat-resistant wax, and the semiconductor substrate is then thinned to a thickness ranging from about 30 to about 80 $\mu$m.

The semiconductor substrate is then etched from its back side by the dry etching process mentioned above using the photo sensitive polyimide material as an etching mask to thereby form viaholes each having a diameter larger than that of the pilot holes. The depth of etching in this procedure is a depth obtained by subtracting the depth of the pilot holes from the thickness of the substrate. By this process, very fine viaholes having a design dimension of, for example, 1 $\mu$m×50 $\mu$m or less can be formed with high accuracy. Such fine viaholes cannot be obtained by conventional techniques.

This method enables the formation of viaholes on every finger of the multi-fingered electrode, can significantly avoid increase in inductance due to conventional wiring or routing and can further improve the high frequency gain 3 dBm or more at 77 GHz.

Third Embodiment

FIGS. 4A to 4E are sectional views illustrating a method of forming backside viaholes as another embodiment of the present invention. In this method, the process of forming viaholes 13 from the back side of a semi-insulating GaAs substrate 10 is applied to manufacture of an MMIC mainly comprising a metamorphic HEMT device.

Figure 4A:
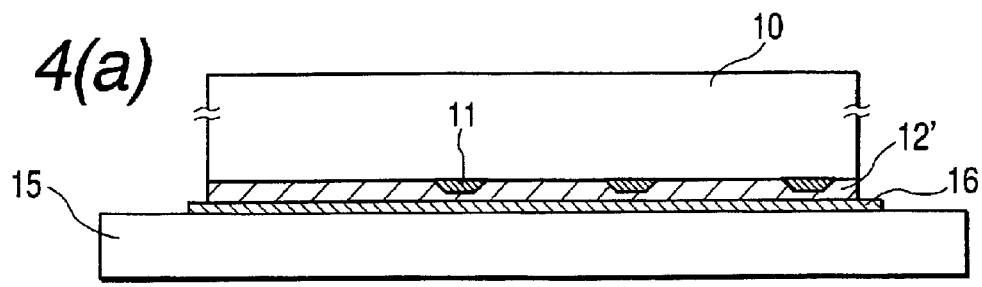
FIGS. 4A to 4E are sectional views illustrating a process of forming backside viaholes of an MMIC mainly comprising a metamorphic HEMT device as another embodiment of the present invention.

With reference to FIG. 4A, main parts 11 of the MMIC, i.e. HEMT devices, and circuits thereof are previously formed on the surface of the GaAs substrate 10, wiring is formed to make contact with viaholes, and the overall surface of the substrate 10 is then covered with a passivation film or a polyimide resin film 12'. The substrate 10 is reversed and is affixed to a base wafer 15 made of, for example, glass or sapphire using a wax 16 having a softening point lower than that of the wax used in First Embodiment.

Figure 4B:
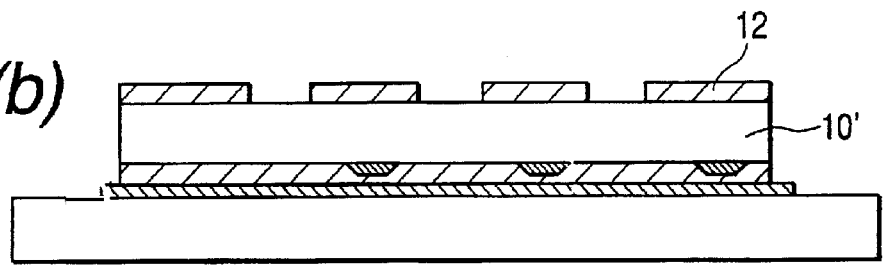

With reference to FIG. 4B, the substrate 10 is thinned from its back side to a thickness of about 50 to 100 $\mu$m in the same manner as in First Embodiment. A film of a photo sensitive polyimide material is formed on the thinned substrate 10 in the same manner as in the process shown in FIG. 2A in First Embodiment to thereby yield a mask pattern 12.

Figure 4C:
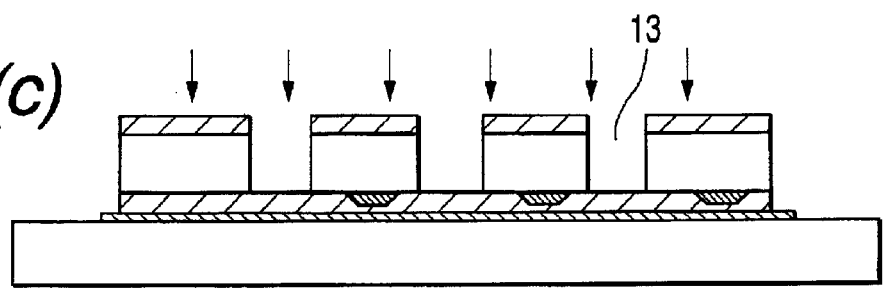

Next, with reference to FIG. 4C, viaholes 13 are formed by dry etching to such an extent that the viaholes 13 penetrate the GaAs substrate 10. The polyimide resin mask 12 cannot be subjected to curing in contrast to that in First Embodiment, since the bonding wax 16 having a low softening point is used in this embodiment. However, the polyimide resin mask 12 used herein has a sufficient thickness of from 10 to 20 µm and can satisfactorily be used in practice without problems.

Figure 4D:
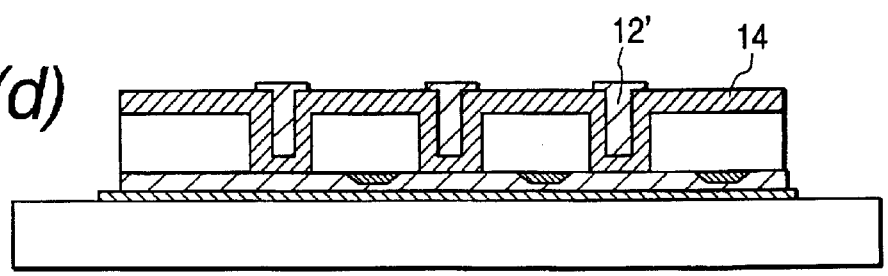

The viaholes 13 can be formed dry etching such as electron cyclotron resonance (ECR) etching under the following conditions: Microwave power: 400 W, power density of RF bias of 13.56 MHz: 0.3 kW/m$^2$, etchant: SiCl$_4$, and etching pressure: 1.0 mTorr. The selectivity to the GaAs substrate 10 in this procedure is as high as about 10. This selectivity is 2 to 3 times larger than that of the conventional thick layer negative type resists, i.e., from 3 to 5. This configuration can yield viaholes having smooth and satisfactory shapes with less roughness of the side walls. Accordingly, a satisfactory gold plated film 14 having a thickness of 5 to 10 µm can be formed in coating of base metals (Mo/Au deposited film) and in gold plating process as shown in FIG. 4D. The viaholes 13 are then filled with a photo sensitive polyimide material 12' in the same manner as in First Embodiment. The filling operation may be omitted in some cases.

Figure 4E:
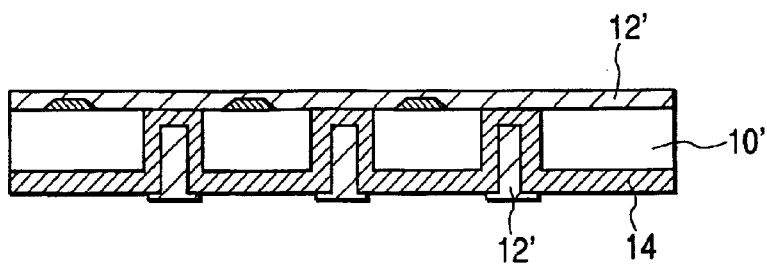

With reference to FIG. 4E, the substrate 10 carrying the MMIC is separated from the base wafer 15 to thereby yield the target MMIC mainly comprising the metamorphic HEMT device.

According to the conventional methods using negative type thick layer resists, the side walls of the resulting viaholes are roughened due to regression of the resists or by action of a polymer layer formed on the side walls upon dry etching. The resulting gold plated film has a decreased thickness to thereby decrease yields and reliability of the resulting devices. In contrast, the method of the present invention can improve both the yield and reliability 20% to 30% higher than the conventional methods and can thereby reduce a production cost about 20%.

The method according to the present embodiment employs a diameter of opening space of the viaholes of 40 µmφ as a standard but the method can produce viaholes having a larger aspect ratio due to improved selectivity of the mask, can improve a layout tolerance as compared with the conventional methods. Thus, very satisfactory advantages can also be obtained in mask design.

These advantages can also be obtained on MMICs mainly comprising GaAs HEMTs and MESFETs using semi-insulating GaAs substrates as in this embodiment.

Fourth Embodiment

FIGS. 5A to 5F are sectional views illustrating a process of manufacturing an MMIC, in which the present invention is applied to manufacture of the MMIC mainly comprising an InP HEMT device. This process is basically similar to the process of First Embodiment shown in FIGS. 2A to 2G, except that the material for the substrate is different.

Figure 5A:
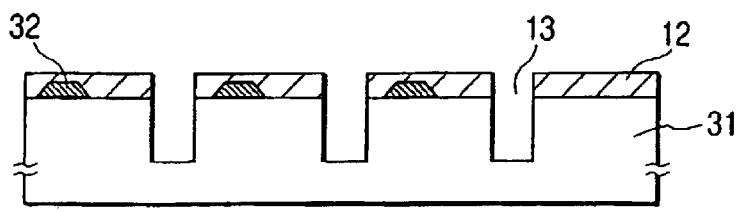
FIGS. 5A to 5F are sectional views illustrating a process of forming viaholes of an MMIC mainly comprising an InP HEMT device as another embodiment of the present invention.

With reference to FIG. 5A, main devices 32 of the MMIC and circuits thereof are formed on the surface of an InP substrate 31, followed by coverage of the surface with a passivation film. In this process step, the photo sensitive polyimide material 12 is used as the passivation film, is exposed using an exposure system and is developed. The resulting covering layer can be used as a mask for the formation of viaholes. To glassify the photo sensitive polyimide material, the film of the photo sensitive polyimide material is cured at 200° C. However, the photo sensitive polyimide material can be cured at relatively low temperatures and can therefore yield a mask having satisfactory etching resistance without damaging AlAs channels that are susceptible to impurities and diffusion thereof.

Using the photo sensitive polyimide mask 12, viaholes 13 having a depth of 50 µm are formed by dry etching, for example, using an inductively coupled plasma (ICP) dry etching system under the following conditions: Antenna output: 400 W, RF bias: 100 W, etchant: Cl$_2$/N$_2$ gaseous mixture, and etching pressure: 1.0 mTorr. In this procedure, the photo sensitive polyimide mask exhibits a selectivity to InP as high as about 10.

The conventional thick layer resists have a low selectivity of about 1 to 2 and are not suitable for micromachining of such devices. In contrast, the method of the present invention can form patterns having a diameter of opening space of 5 µmφ or more without problems. The viaholes formed by the method of the invention have substantially smooth side walls with less roughness after dry etching. Thus, a gold plated layer 14 formed in the subsequent process step can have a sufficient thickness and the resulting device can therefore have a satisfactory yield and reliability.

Figure 5B:
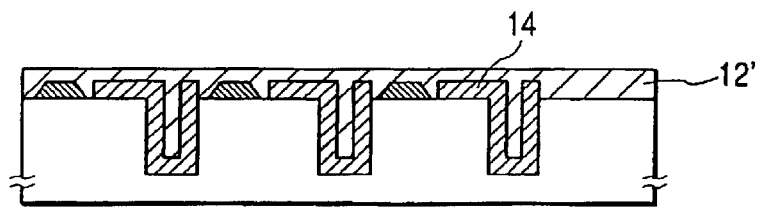
Figure 5C:
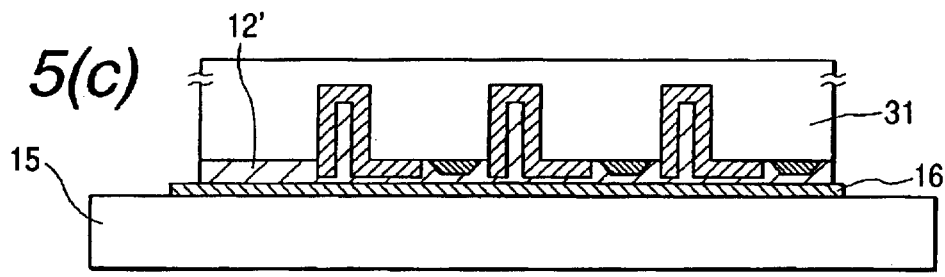
Figure 5D:
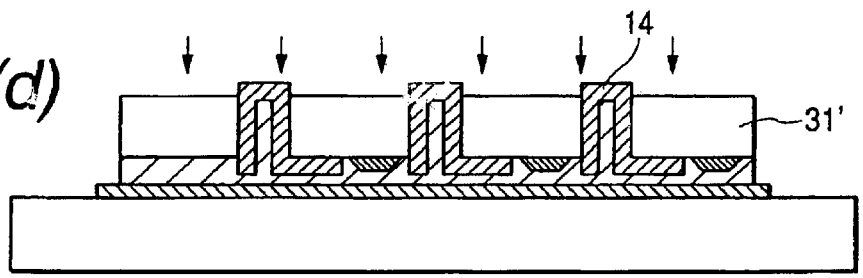

With reference to FIG. 5B, the viaholes 13 carrying the gold plated layer 14 on the inner walls thereof is then filled and fixed with the photo sensitive polyimide material 12' according to the invention. With reference to FIG. 5C, the substrate is then reversed and is affixed to a base wafer 15 made of, for example glass or sapphire using a heat-resistant wax 16.

With reference to 5D, the substrate 31' is thinned from its back side to a thickness of about 50 µm. A mask is then formed from the back side of the substrate using a photo sensitive polyimide material or resist, and the InP substrate 31' is etched by dry etching and wet etching to thereby make the viaholes 13 open which are previously formed from the surface of the substrate.

Figure 5E:
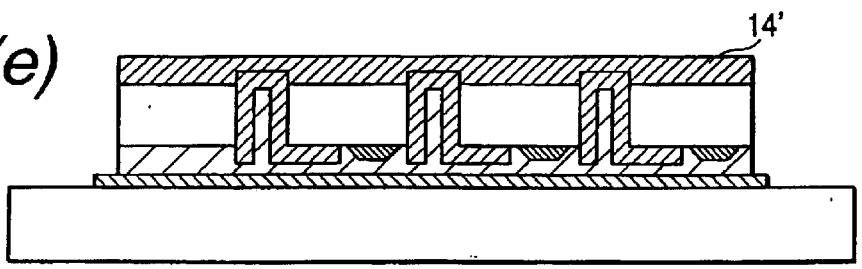

The overall face of the substrate 31' is then plated with gold to thereby form a gold plated film 14' as shown in FIG. 5E. In this process step, the viaholes are allowed to penetrate the substrate, by etching from the back side of the substrate. Alternatively, the viaholes can be allowed to penetrate the substrate in the following manner when the formed viaholes have an accurately controlled depth of 50µm with satisfactory uniformity. Specifically, the substrate is thinned to such a depth immediately before the viaholes penetrate the substrate, and the overall back side of the InP substrate is then wet-etched to thereby allow the viaholes to penetrate the substrate.

In the latter process, the overall face of the substrate 31' is then plated with gold to thereby form the gold plated film 14.

Figure 5F:
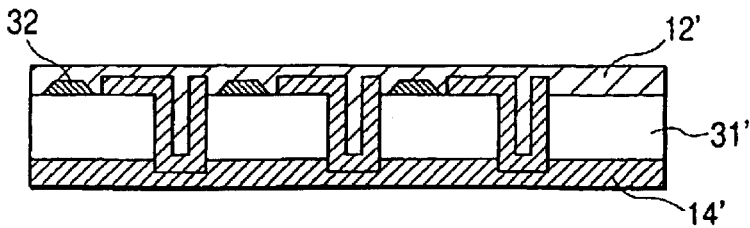

Ultimately, with reference to FIG. 5F, the substrate 31' carrying the MMIC is separated from the base wafer 15 and thereby yields the target MMIC 32 mainly comprising the InP HEMT device.

Such InP HEMTs liberate large quantity of heat, and the formation of viaholes is an important issue to ensure satisfactory reliability of the devices. However, InP is etched at a low rate, and satisfactory mask materials for etching of InP have not been found. The method of present invention using the photo sensitive polyimide material that has high selectivity and can easily be patterned as the mask dramatically improves a process throughput. The gold plated layer 14' in FIG. 5F can be used as a heat-sink, and the resulting device can satisfactorily dissipate heat and can exhibit sufficient reliability in practice.

Fifth Embodiment

Figure 6A:
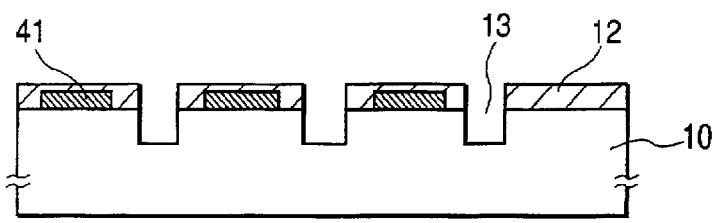
FIGS. 6A to 6F are sectional views illustrating a process of forming viaholes and heat-sinks of an MMIC mainly comprising a GaAs HBT device as another embodiment of the present invention.

FIGS. 6A to 6F are sectional views illustrating a process of manufacturing an MMIC module mainly comprising a hetero-junction bipolar transistor (HBT) in which the present invention is applied to the process of forming viaholes. With reference to FIG. 6A, HBT devices and circuits thereof are previously formed on the surface of a GaAs substrate 10 in regions 41 on which the MMIC will be formed. A patterned photo sensitive polyimide mask 12 having a thickness of from 1 to 2 μm is then formed from the surface of the substrate, and viaholes 13 are formed using the photo sensitive polyimide mask 12 as a mask in the same manner as in the process steps shown in FIGS. 2A and 2B in First Embodiment. By this procedure, the viaholes 13 are formed from the surface of the substrate using the highly selective mask, and the resulting viaholes 13 thereby have a depth of 10 μm and a diameter of opening space of 10 μmϕ with high alignment accuracy.

Figure 6B:
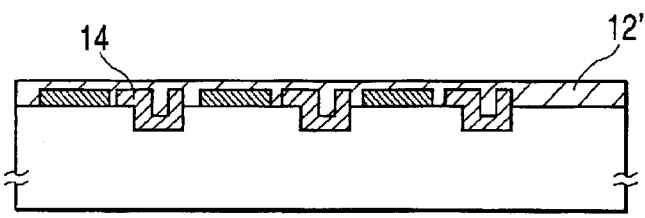
Figure 6C:
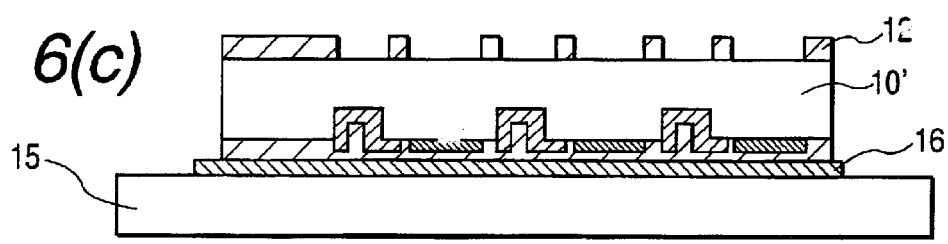

With reference to FIG. 6B, a gold wiring 14 is applied into the viaholes 13 by gold plating process, and regions where the viaholes 13 are formed are then molded or sealed with the photo sensitive polyimide material 12' to improve the reliability of the resulting devices.

In such HBT devices, an emitter current increases with an elevating temperature, and the increased emitter current further increases the temperature, thus inviting "thermal runaway" in many cases. As a countermeasure to this problem, the substrate immediately underneath the devices is thinned as much as possible, and the thinned regions of the substrate are then coated with a metal to thereby yield a heat-sink structure which can dissipate heat. A method of forming the viaholes and heat-sink structure will be described below.

The substrate 10 obtained in the process step of FIG. 6B is reversed and is affixed in a horizontal position to a base wafer 15 such as a glass or sapphire substrate using a heat-resistant wax 16. The substrate 10 is then thinned to a thickness of from 30 to 50 μm by grinding or polishing to yield a thinned substrate 10'. A photo sensitive polyimide mask 12 according to the invention is then formed on the substrate from its back side using a double-side contact aligner.

Figure 6D:
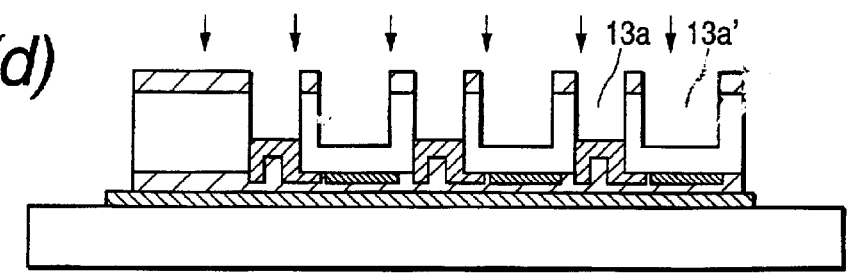

Using the photo sensitive polyimide mask 12 as the mask, viahole regions 13a and HBT device regions 13a' are etched by dry etching or wet etching as shown in FIG. 6D. The etching procedure is completed when the viaholes 13 penetrate the substrate 10' and the gold wiring 14 becomes open.

Figure 6E:
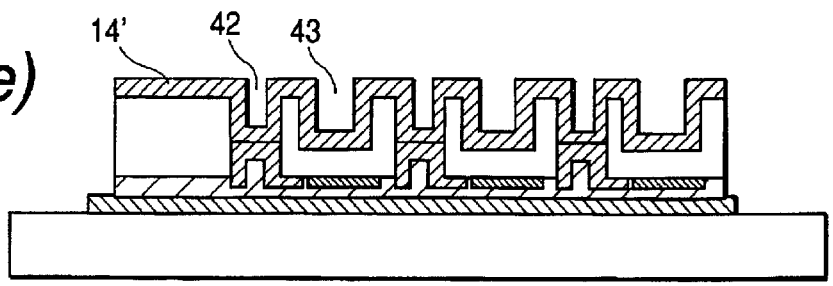

With reference to FIG. 6E, the mask 12 is then removed, the overall back side of the substrate 10' is plated with gold and thereby yields gold-plated viahole regions 42 and heat-sink regions 43 in one process step. In the present embodiment, the substrate has a thickness of 50 μm in general and a thickness of 10 μm in the heat-sink regions 43. In this case, the depth of thinning of the substrate in the heat-sink regions 43 from the back side is 40 μm or more, and such a thinning procedure can be achieved first by the use of the highly selective photo sensitive polyimide mask 12 according to the present invention.

Figure 6F:
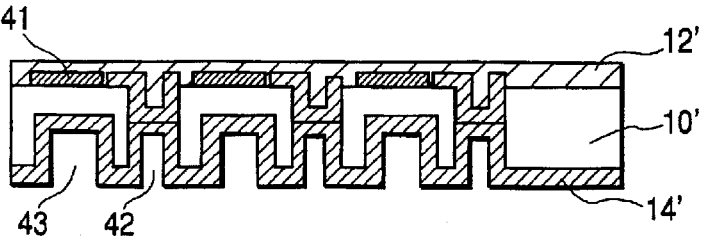

Ultimately, the substrate 10' carrying the MMIC is separated from the base wafer 15 and thereby yields the target MMIC mainly comprising the HBT device, as shown in FIG. 6F.

This method can very easily form the viahole structure 42 and the heat-sink structure 43 and can thereby yield high throughput. The process can also improve the high frequency properties of the resulting device and can significantly minimize increase in operating temperature and thereby avoid thermal runaway that constitutes a problem of the HBT device. The resulting device has a significantly prolonged life of 10000 hours or more as determined by an accelerating test in comparison with that of the conventional equivalents comprising no heat-sink structure, 1000 hours.

Figure 7:
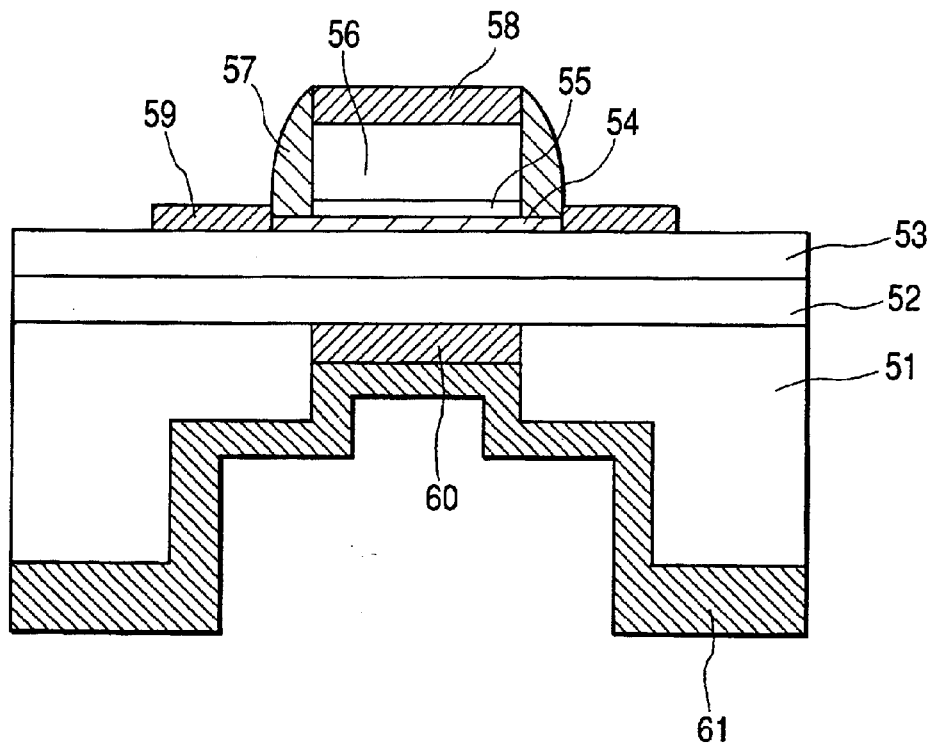
FIG. 7 is a sectional view illustrating a sectional structure of a collector-up HBT device as another embodiment of the present invention.

FIG. 7 is a sectional view of a collector-up HBT device. In the device, a semi-insulating GaAs substrate 51 underneath a backside gold plated layer 61 is thinned to the interface with a $n^+$-GaAs emitter contact layer 52, an emitter electrode 60 is formed on the thinned substrate 51 to thereby connect with the backside gold plated layer 61. By this configuration, the resulting device can effectively prevent thermal runaway and has satisfactory reliability. FIG. 7 shows an $n^+$-$Al_{0.3}Ga_{0.7}As$/n-$In_{0.5}Ga_{0.5}P$ emitter layer 53, a $p^+$-$GaAs_{0.5}P_{0.5}$ base layer 54, an $n^+$-GaAs/n-GaAs collector layer 55, an $n^+$-$In_{0.5}Ga_{0.5}As$ collector contact layer 56, a $SiO_2$ side wall 57, a collector electrode 58, and a base electrode 59. The present embodiment is illustrated by taking an MMIC module mainly comprising a GaAs HBT as an example. The same advantages can also be obtained upon MMICs using InP HBTs and the collector-up HBTs.

Sixth Embodiment

Figure 8:
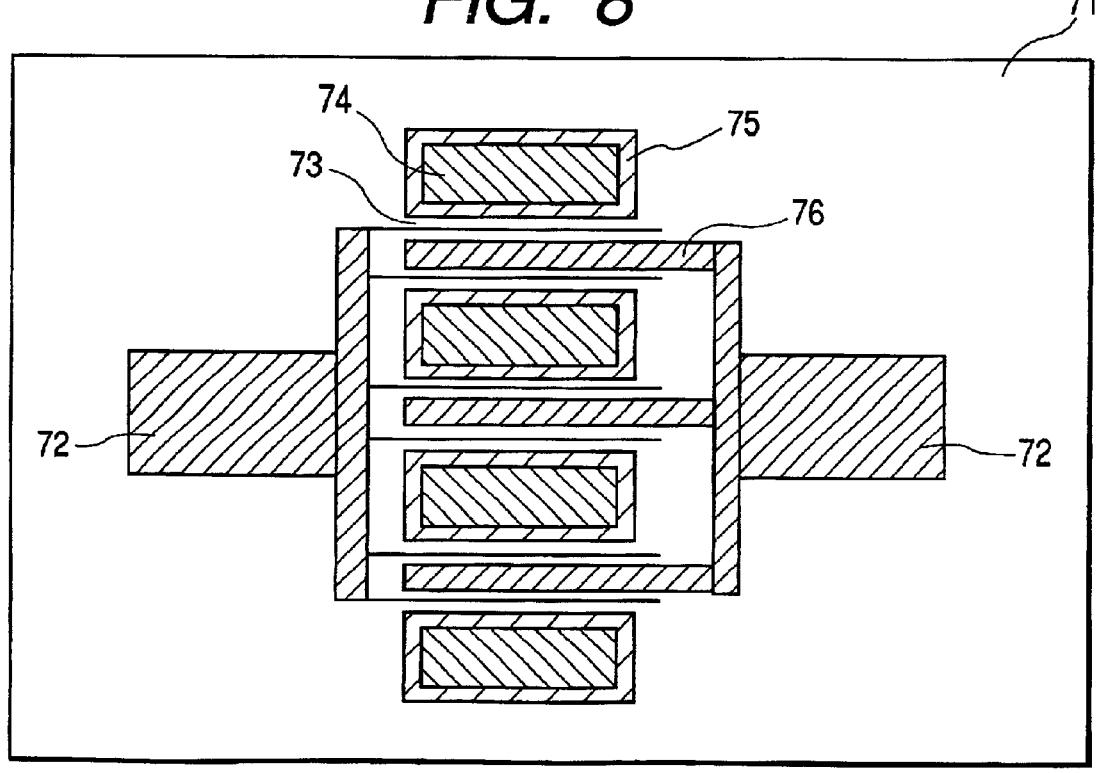
FIG. 8 is a plan view illustrating a multi-fingered electrode high-frequency circuit and the layout of fine viaholes thereof as another embodiment of the present invention.

FIG. 8 is a plan view showing a layout of a device as an embodiment of the present invention, in which the process of forming viaholes according to the present invention is applied to a high frequency semiconductor module mainly comprising a compound semiconductor field effect transistor such as an MESFET or HEMT.

In this device, an amplifier circuit having a multi-fingered electrode (a gate electrode) structure 73 is formed on the surface of a semi-insulating GaAs semiconductor substrate 71. A wiring 72 to be a signal conductor is arranged, and ground viaholes 74 penetrating the semiconductor substrate 71 from its surface to its back side are formed. A drain electrode 76 of the multi-fingered electrode structure 73 is connected to the wiring 72 to be a signal conductor.

According to the conventional methods, a single viahole is arranged outside an active circuit, the surface of a substrate is covered with, for example, an interlayer passivation film, and the device is connected by a multilayer wiring technique. In contrast, according to the present invention, the ground viaholes 74 are formed in the regions of source electrodes 75 to thereby directly ground to the back side of the substrate, and each of the ground viaholes 74 is arranged corresponding to each of fingers of the multi-fingered electrode (gate electrode) 73. This configuration can suppress increase in inductance due to wiring or routing and can significantly improve the high frequency properties of the resulting device.

The conventional methods, in which viaholes are formed from the backside of the substrate, exhibit an alignment accuracy of a contact aligner of at most ±1 μm. When the conventional resist masks each having a low selectivity are used, the pattern transfer accuracy in viahole formation is about ±30 μm. These conventional techniques exhibit very low alignment accuracy in viahole formation and cannot be applied to the module which requires an alignment accuracy of at least ±0.5 μm.

In contrast, the viaholes 74 can be formed from the surface of the substrate by the process according to the present invention. Specifically, each of electrodes and wiring is formed by photolithography using electron beam (EB) exposure or an i-line stepper, an $SiO_2$ mask about 1 μm thick is then formed by i-line lithography and dry etching, and the viaholes are formed from the surface of the substrate to a depth of about 10 μm using the $SiO_2$ mask. By using the highly selective $SiO_2$ mask and the highly accurate i-line lithography, the resulting viaholes have an alignment accuracy controlled within a range of ±0.1 μm.

Next, wiring is formed by coating the inside of the viaholes with base metals such as an Mo/Au deposited film and plating the coated viaholes with gold. The substrate 71 is then reversed and is thinned to a thickness of about 80 μm, and the thinned substrate is dry-etched using the photo sensitive polyimide mask according to the invention to a depth of about 70 μm to thereby allow the viaholes to penetrate the substrate.

The substrate is then coated with base metals and is plated with gold from its back side, a ground wiring is formed to yield the target device. The backside viaholes are formed for grounding and may have diameters sufficiently larger than those of the surface viaholes in consideration of the alignment accuracy and other factors.

In this connection, when a module including viaholes 74 having a surface design dimension of 2 μm×50 μm (a backside dimension of 3 μm×55 μm) corresponding to individual fingers of the multi-fingered electrode is formed, the resulting module exhibits a high frequency gain at 77 GHz 5 dBm or more higher than that of a module formed by the conventional technique in which a single viahole (a design dimension of 40 μm×40 μm) is formed outside a circuit.

Naturally, the method of the present invention can yield very fine viaholes having a design dimension of 1 μm×20 μm or less.

Figure 9:
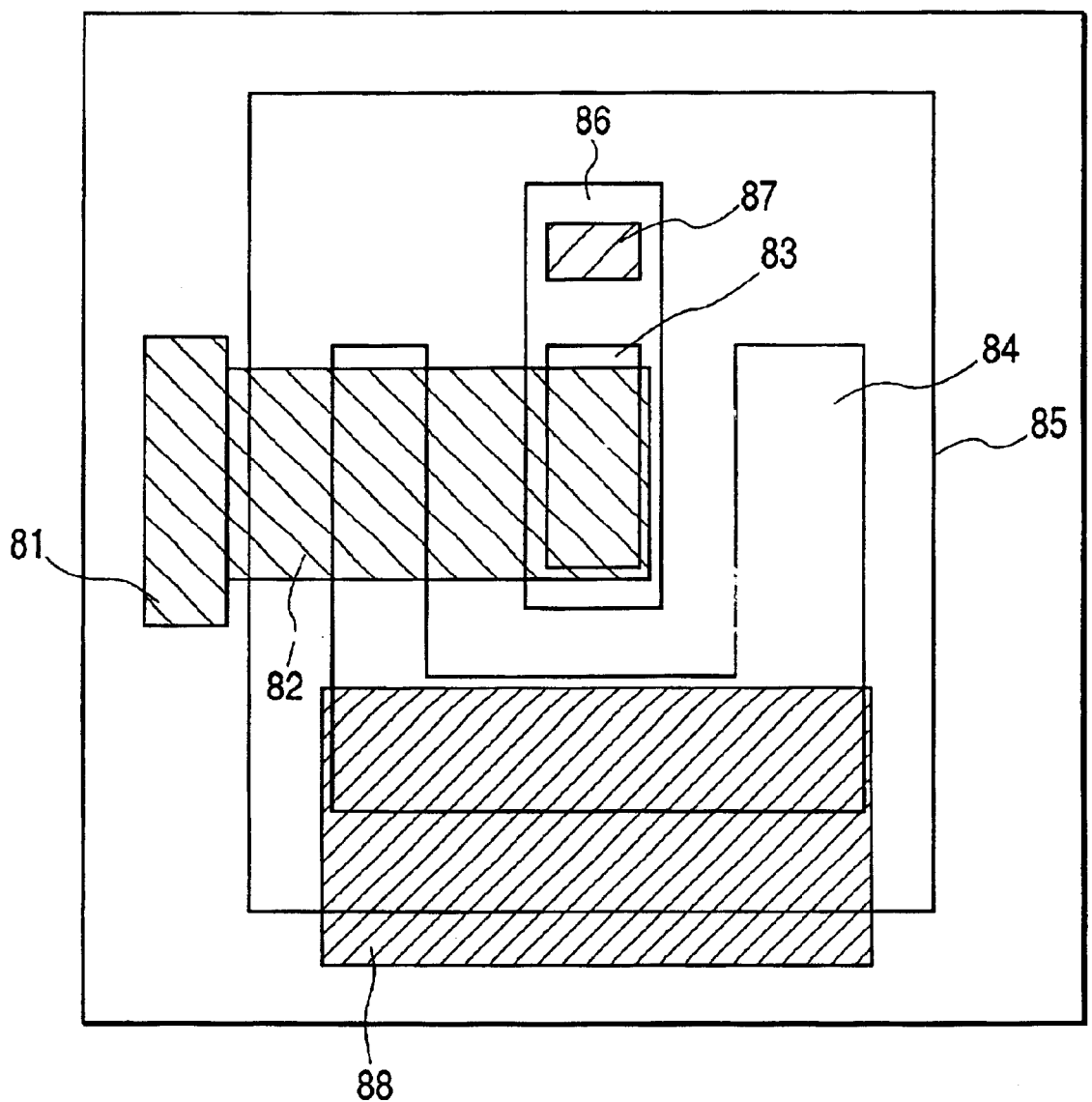
FIG. 9 is a plan view illustrating an HBT device and the layout of fine viaholes thereof as another embodiment of the present invention.

The same advantages can be obtained in HBT devices and modules mainly comprising the HBT devices. FIG. 9 is a plan view schematically illustrating a layout of a module to which the present invention is applied.

According the conventional techniques, such a module is formed by a process in which a single ground viahole having a design dimension of 50 μm×50 μm is arranged outside the circuit, and four to ten HBT devices as a single unit are connected to an emitter electrode. In contrast, according to the present invention, ground viaholes having a design dimension of 2 μm×10 μm are formed, each of which ground viaholes corresponds to each of the emitter electrodes. The resulting device can significantly minimize increase in inductance due to wiring, can satisfactorily dissipate heat and exhibits an output power at a frequency of 2.5 GHz 5 dBm or more higher than that of conventional equivalents. In addition, the resulting device has a significantly prolonged life (reliability) of 20000 hours or more as determined by an accelerating test in comparison with that of the conventional equivalents, 1000 hours. FIG. 9 illustrates a ground viahole 81, an emitter electrode wiring 82, an emitter electrode 83, a collector electrode 84, a device isolation boundary 85, a base electrode 86, a base electrode wiring 87, and a collector electrode wiring 88.

As thus described above, the present invention uses the mask material that is highly resistant to dry etching and can yield a mask at low temperatures in the formation of viaholes in semiconductor devices. The invention can therefore provide a method of manufacturing a semiconductor device, which method can form fine viaholes in high yields and can produce high-performance superhigh-frequency semiconductor devices.

While the present invention has been described with reference, to what are presently considered to be the preferred embodiments, it is to be understood that the invention is not limited to the disclosed embodiments. On the contrary, the invention embraces various modifications and equivalent arrangements within the spirit and scope of the appended claims. The scope of the following claims is to be accorded the broadest interpretation so as to encompass all such modifications and equivalent structures and functions.

What is claimed is:

1. A method of manufacturing a semiconductor device, the method comprising the steps of:

forming at least an active device on a principal surface of a semiconductor substrate;

etching the semiconductor substrate with the use of a photo sensitive polyimide material as an etching mask from the surface of the substrate on which the active device is formed to thereby form a viahole adjacent to an active region where the active device is formed;

forming a plated wiring, the plated wiring including an inner wall of the viahole and extending to an electrode of the active device on the surface of the substrate;

reversing the substrate and temporarily fixing the reversed substrate on a base wafer with an adhesive;

grinding or polishing the back side of the semiconductor substrate temporarily fixed on the base wafer to thereby thin the substrate;

subjecting the thinned substrate to wet etching to thereby make the plated wiring at the inside bottom of the viahole open; and separating the semiconductor substrate carrying the viahole from the base wafer.

2. The method according to claim 1, wherein the semiconductor substrate comprises a substrate including a multilayer epitaxial film of III–V compound semiconductor.

3. The method according to claim 1, wherein the step of etching to form a viahole includes dry etching the semiconductor substrate using said polyimide material as an etching mask.

4. The method according to claim 3, wherein said mask has a selectivity to the dry etching of at least about 10 with respect to the semiconductor substrate.

5. A method of manufacturing a semiconductor device, the method comprising the steps of:

forming at least an active device on a principal surface of a semiconductor substrate;

etching the semiconductor substrate with the use of a photo sensitive polyimide material as a first etching mask from the surface of the substrate on which the active device is formed to thereby form a viahole adjacent to an active region where the active device is formed;

forming a plated wiring, the plated wiring including the inner wall of the viahole and extending to an electrode of the active device on the surface of the substrate;

reversing the substrate and temporarily fixing the reversed substrate on a base wafer with an adhesive;

grinding or polishing the back side of the semiconductor substrate temporarily fixed on the base wafer to thereby thin the substrate;

etching the thinned substrate with the use of a photo sensitive polyimide material as a second etching mask in a region to be a viahole and a region directly underneath the active device on the surface of the substrate from the back side of the substrate to make the plated wiring at the inside bottom of the viahole open to thereby form a viahole structure and a heat-sink structure in one process step;

plating a metal on overall of the back side of the substrate to thereby form a plated metal layer; and separating the semiconductor substrate carrying the viahole from the base wafer.

6. The method according to claim 3, wherein said mask has a selectivity to the dry etching of at least about 20 with respect to the semiconductor substrate.

7. The method according to claim 5, wherein the first step of etching includes first dry etching of the semiconductor substrate using said first etching mask.

8. The method according to claim 7, wherein said first etching mask has a selectivity to the first dry etching of at least about 10 with respect to the semiconductor substrate.

9. The method according to claim 7, wherein said first etching mask has a selectivity to the first dry etching of at least about 20 with respect to the semiconductor substrate.

10. The method according to claim 5, wherein the second step of etching includes second dry etching of the semiconductor substrate using said second etching mask.

11. The method according to claim 10, wherein said second etching mask has a selectivity to the second dry etching of at least about 10 with respect to the semiconductor substrate.

12. The method according to claim 10, wherein the polyimide material of said second etching mask is baked but not cured.

* * * * *